United States Patent [19]
Holcomb et al.

[11] Patent Number: 5,154,316
[45] Date of Patent: Oct. 13, 1992

[54] HORIZONTAL OSCILLATORY FEEDER

[75] Inventors: Gregory W. Holcomb, 1060-K N. Batavia St., Orange, Calif. 92667; Scott A. Smith, Orange, Calif.

[73] Assignee: Gregory W. Holcomb, Orange, Calif.

[21] Appl. No.: 613,607

[22] Filed: Nov. 14, 1990

[51] Int. Cl.$^5$ .............................................. B65H 3/62
[52] U.S. Cl. .................... 221/202; 221/130; 221/200; 221/239; 221/258; 414/403; 414/415; 198/750; 29/740
[58] Field of Search ............... 221/123, 130, 200, 202, 221/204, 224, 236, 239, 252, 258, 290, 294; 222/196; 414/403, 404, 415; 29/740, 741, 759, 809; 198/750

[56] References Cited

U.S. PATENT DOCUMENTS

| | | | |
|---|---|---|---|
| 2,632,588 | 3/1953 | Hoar | 221/200 X |
| 2,710,712 | 6/1955 | Friedman | 221/200 X |
| 2,752,733 | 7/1956 | Peden | 221/200 X |
| 3,347,414 | 10/1967 | Daines | 221/200 |
| 4,019,626 | 4/1977 | Kamner | 198/750 |
| 4,505,380 | 3/1985 | McLemore et al. | 198/750 |
| 4,612,852 | 9/1986 | Price et al. | 221/202 X |
| 4,651,869 | 3/1987 | Grief | 198/750 |
| 4,690,302 | 9/1987 | Zebley et al. | 221/200 X |
| 4,785,929 | 11/1988 | Foster | 198/750 |
| 4,823,938 | 4/1989 | Foster | 198/750 |
| 4,862,578 | 9/1989 | Holcomb | 414/403 X |

Primary Examiner—Robert P. Olszewski
Assistant Examiner—Dean A. Reichard
Attorney, Agent, or Firm—Roberts and Quiogue

[57] ABSTRACT

A horizontal oscillatory feeder apparatus is disclosed for feeding a plurality of different types of electrical components of varying mass along respective tracks to component pick-up stations. The components and the tracks are supported on a base plate, which is excited in an oscillatory movement. The movement of the base plate is constrained so that movement is permitted only along an axis parallel to the feeder tracks. An excitation apparatus excites the base plate so that the acceleration forces applied to the components in a desired direction of movement exceeds the frictional force tending to prevent slippage of the components on the tracks; the acceleration forces applied to the components in the opposite direction are limited so that the components do not slip on the track in the opposite direction to the desired movement. A component clamp may be located at the end of the respective tracks to clamp the components in place at respective pick-up locations once the components have been fed forward to the pick-up locations by the effect of the oscillatory movement.

35 Claims, 11 Drawing Sheets

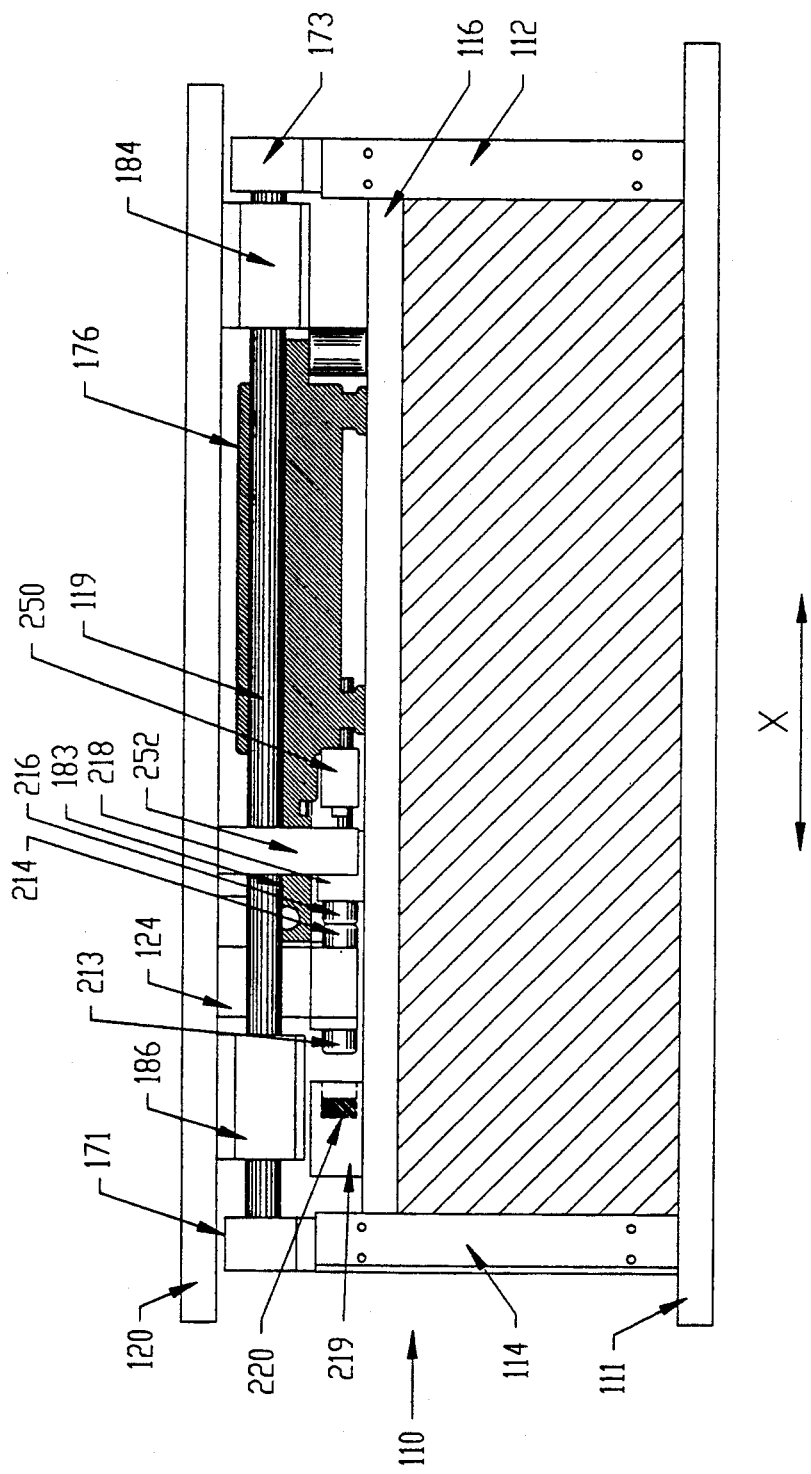

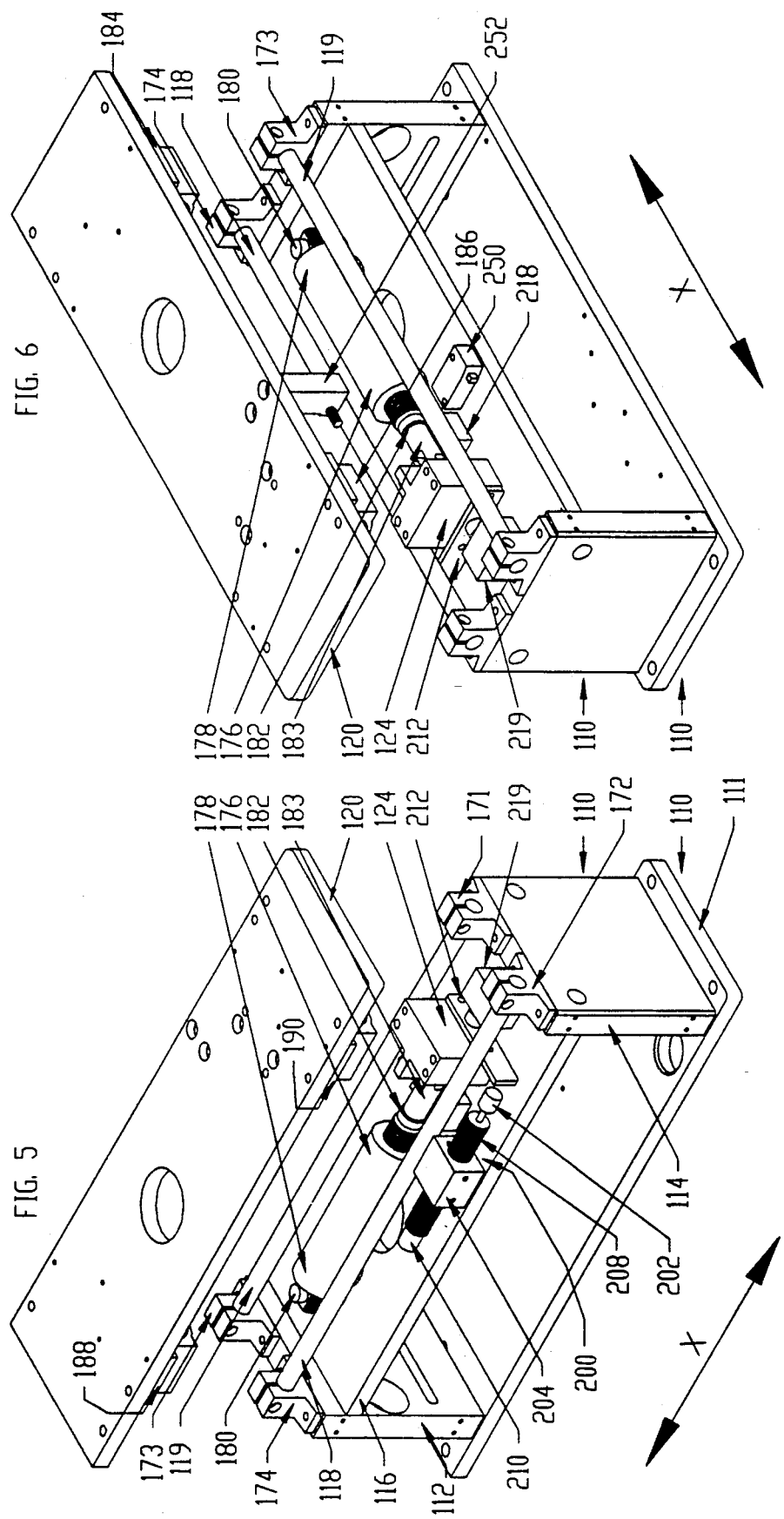

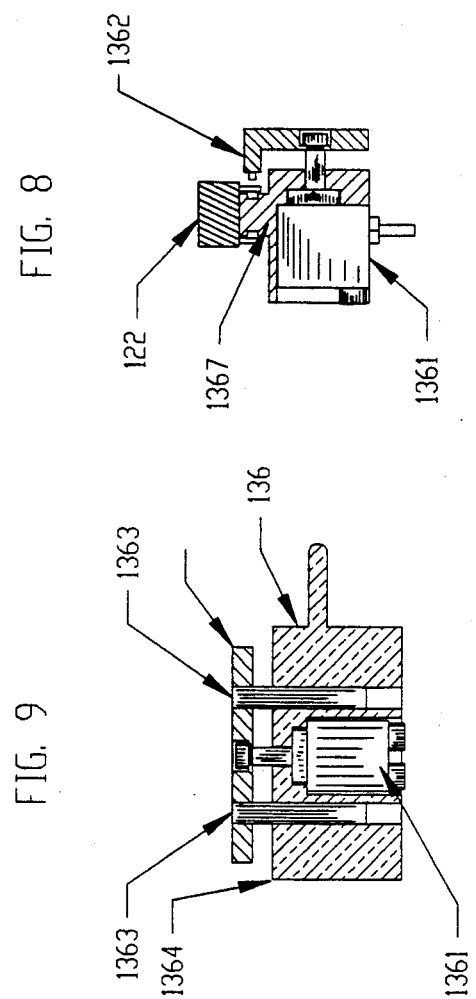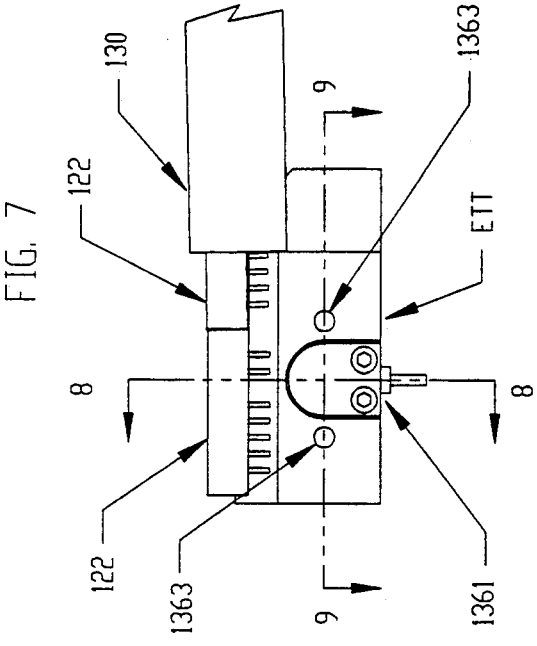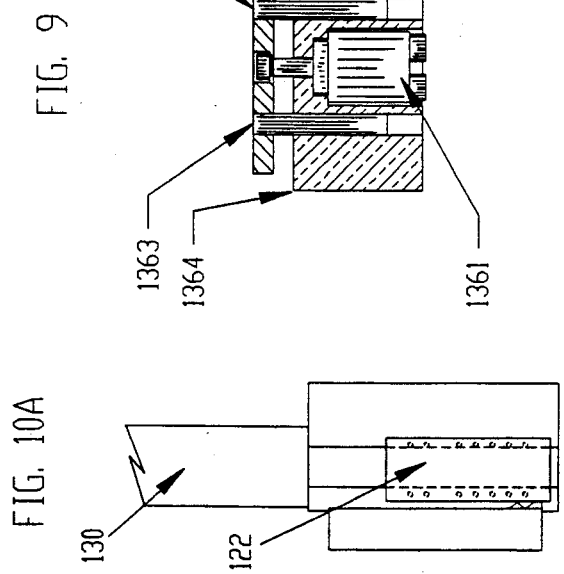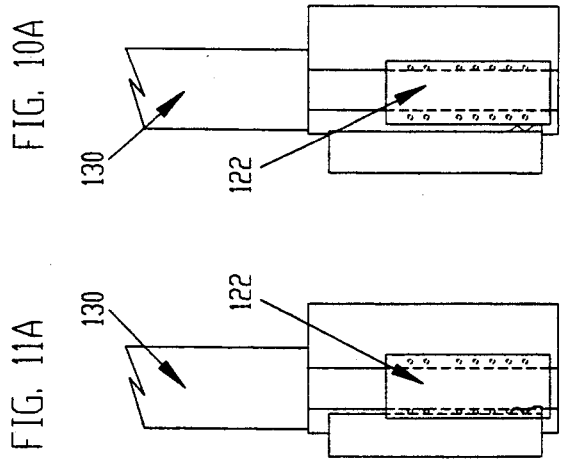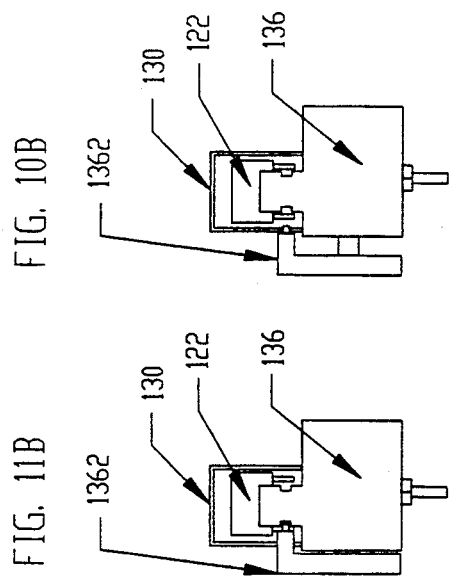

FIG. 14

| EXTEND | ENABLE | SELECT | SIGNAL GENERATOR 302 | SIGNAL GENERATOR 304 | CYLINDER RELAY SIGNAL 311 | RELAY SIGNAL 313 |
|---|---|---|---|---|---|---|
| 0 | 0 | 0 | 0 | 0 | 0 | 0 |
| 0 | 0 | 0 | 0 | 1 | 0 | 0 |
| 0 | 0 | 0 | 1 | 0 | 0 | 0 |
| 0 | 0 | 0 | 1 | 1 | 0 | 0 |
| 0 | 0 | 1 | 0 | 0 | 0 | 0 |
| 0 | 0 | 1 | 0 | 1 | 0 | 0 |
| 0 | 0 | 1 | 1 | 0 | 0 | 0 |
| 0 | 0 | 1 | 1 | 1 | 0 | 0 |
| 0 | 1 | 0 | 0 | 0 | 0 | 0 |
| 0 | 1 | 0 | 0 | 1 | 0 | 0 |
| 0 | 1 | 0 | 1 | 0 | 1 | 0 |
| 0 | 1 | 0 | 1 | 1 | 1 | 0 |
| 0 | 1 | 1 | 0 | 0 | 0 | 1 |
| 0 | 1 | 1 | 0 | 1 | 1 | 1 |
| 0 | 1 | 1 | 1 | 0 | 0 | 1 |
| 0 | 1 | 1 | 1 | 1 | 1 | 1 |
| 1 | 0 | 0 | 0 | 0 | 1 | 0 |
| 1 | 0 | 0 | 0 | 1 | 1 | 0 |
| 1 | 0 | 0 | 1 | 0 | 1 | 0 |
| 1 | 0 | 0 | 1 | 1 | 1 | 0 |
| 1 | 0 | 1 | 0 | 0 | 1 | 0 |
| 1 | 0 | 1 | 0 | 1 | 1 | 0 |
| 1 | 0 | 1 | 1 | 0 | 1 | 0 |
| 1 | 0 | 1 | 1 | 1 | 1 | 0 |
| 1 | 1 | 0 | 0 | 0 | 0 | 0 |
| 1 | 1 | 0 | 0 | 1 | 0 | 0 |
| 1 | 1 | 0 | 1 | 0 | 1 | 0 |
| 1 | 1 | 0 | 1 | 1 | 1 | 0 |
| 1 | 1 | 1 | 0 | 0 | 0 | 1 |
| 1 | 1 | 1 | 0 | 1 | 1 | 1 |
| 1 | 1 | 1 | 1 | 0 | 0 | 1 |
| 1 | 1 | 1 | 1 | 1 | 1 | 1 |

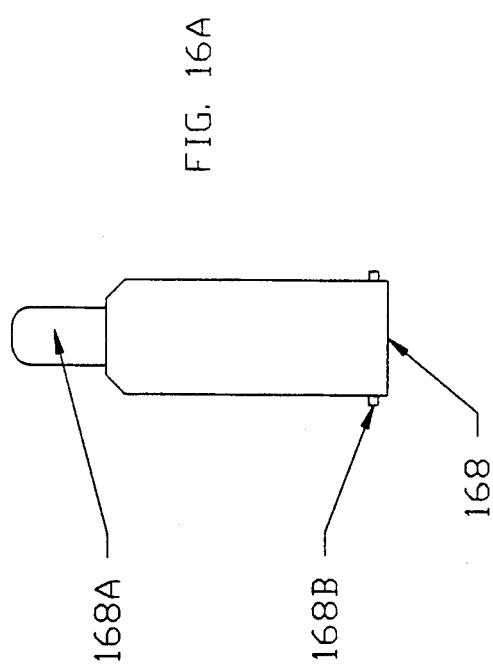
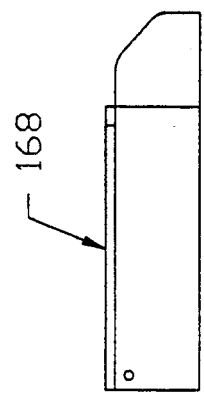
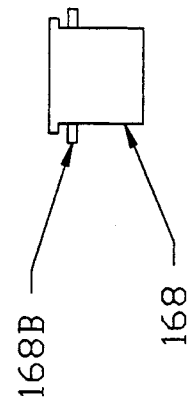

ized pickup station. However, such a feeder is suitable for a high volume, single part feeding operation, since at any given time, the feeder will be configured for a particular component. A vibrating or "live" track section driven by vibratory unit delivers the components from the tube to a "dead" track section.
HORIZONTAL OSCILLATORY FEEDER

BACKGROUND OF THE INVENTION

The present invention relates to the field of robotic insertion systems for the insertion of electrical components into circuit boards, and more particularly to an improved horizontal oscillatory feeder providing a high part mix.

Robotic systems are commonly used to insert electrical components into circuit boards. These systems automate the process of "stuffing" boards with electrical components. Typically a system will include robot which picks a component up at a pickup station and then inserts it at a predetermined location in a circuit board.

Many types of electrical components are delivered by the manufacturer to the board fabricator in tube magazines. For example, tube magazines are commonly used to store and ship dual in-line package (DIP) components. The components are removed from the tube magazines prior to pick up by the robot. There are available on the market today tube magazine feeder devices which hold a plurality of tube magazines in a stacked relationship, and unload the components in the lowermost tube onto a component track for delivery to the pickup station. After a tube is emptied, it is ejected from the feeder device and the next loaded magazine drops into the unloading position.

One tube magazine component feeder is described in U.S. Pat. No. 4,862,578, by Gregory W. Holcomb. The feeder described in this patent is adjustable to accommodate various tube magazine and component configurations, and is of a horizontal configuration, in that the components are fed along a horizontal track to a horizontally orientated pickup station. However, such a feeder is suitable for a high volume, single part feeding operation, since at any given time, the feeder will be configured for a particular component. A vibrating or "live" track section driven by vibratory unit delivers the components from the tube to a "dead" track section.

Conventional vibratory units which are used to move components along a track to a pickup station are in wide use. However, the operation of such vibratory units is very sensitive to the weight and length of the track and to the weight of the component. This is because the track is typically supported on spring elements, and a magnetic actuator used to impart energy to one of the spring elements. As a result, the force imparted to the components on the track has a substantial force component normal to the track, in addition to the desired force component in the direction of the track. As a result, if the vibrational force is too high, the components may actually be lifted off the track, and in extreme cases can be launched into the air from the track. Moreover, the longer the track, the more uneven the forces applied to components on the track. As a result, the conventional vibratory feeder is extremely sensitive to the weight of the component and requires fine tuning to obtain proper operation for a given type of component.

U.S. Pat. No. 4,910,859, by Gregory W. Holcomb, describes another type of tube magazine feeder configuration. At FIG. 22 the tube magazine feeders 907 are gravity fed, as opposed to the vibratory feed system used in the tube magazine feeder of U.S. Pat. No. 4,862,578. Moreover, the feeders 907 can be configured for a high part mix, since the various tube magazines can each hold a different type of part from the other magazines. However, a drawback to this type of feeder is that the robotic equipment which picks up parts from the feeder must be designed to operate at the angle at which the feeders are orientated, in this case 45 degrees from the horizontal, and then be rotated so that the gripped component is held at the horizontal. This increases the complexity of the robot end effector.

Another type of tube magazine feeder employs a tilting apparatus to tilt a plurality of tube magazines to gravity feed components to a pickup location, and then return the tube magazines to the horizontal. This approach requires the added complexity of the tilting apparatus, and can lead to component lead damage or bending if the component's feed travel is stopped by a lead stop element. If a body stop element is used, the body-to-lead variations from component to component can provide unreliable locating of the component leads in relation to pick-up robot.

It is therefore an object of this invention to provide an apparatus for reliably moving components along a track which is relatively insensitive to the mass of the component.

Another object of this invention to provide a horizontal oscillator feeder which provides a high part mix capability, which is relatively insensitive to the mass of the components, and which does not damage component leads.

SUMMARY OF THE INVENTION

In accordance with the present invention, an apparatus for feeding an object in a desired direction along a track supporting the object and extending along a generally horizontal track axis is disclosed. In a general sense, the apparatus includes a means for constraining the track from moving except in directions parallel to the track axis. The apparatus further includes means for oscillating the track in directions along the axis to achieve acceleration forces in the desired direction of movement on the object which exceed the frictional forces between the track and the object tending to oppose slippage. This results in slippage of the object in relation to the track, thereby feeding the object along the track in the desired direction.

In accordance with a further aspect of the invention, a feeding cycle of oscillatory movement includes an initial cycle of movement which imparts relatively large acceleration forces on the object to result in movement of the object in relatively large movement increments on each oscillation, and a final cycle of movement which results in relatively smaller acceleration forces on the object, thereby resulting relatively small incremental movement increments on each oscillation. The final cycle of movement is useful for reliably placing the object at a pick-up location.

In accordance with a further aspect of the invention, a plurality of tracks are mounted on a feeder base plate, each capable of feeding electrical components of a different type and mass forward to respective pick-up locations. Due to the relative insensitivity of the feeder apparatus to the mass of the components to be fed along the tracks, it can reliably and simultaneously feed such dissimilar components, e.g., from a plurality of tube magazines supported on the base plate. Thus, a single feeder apparatus may be used to feed many different types of electrical components, taking the place of a plurality of different feeder apparatus required heretofore. The base plate is supported on a base structure, by a bearing structure which permits movement of the base plate only along a single horizontal axis. The bearing does not permit movement of the plate in the vertical direction, or indeed in any horizontal axis except the single horizontal axis. The base structure further includes an oscillatory drive mechanism which can be actuated to repetitively drive the plate along the axis, first in one direction and then the other. Throughout the oscillatory movement, the acceleration forces on the components are less than the frictional forces tending to oppose slippage of the components on the track, except that acceleration forces in the desired direction of movement are applied which exceed these frictional forces, thereby resulting in net slippage of the components on the track in the desired direction. In a preferred embodiment, the drive mechanism includes a double-acting pneumatic cylinder with a piston which is extended, and then repetitively incrementally retracted and extended to obtain the oscillatory movement. The acceleration forces which exceed the frictional forces are obtained by abruptly stopping the piston movement in the desired direction of component movement, by running the piston into a dampener element.

Once the components have been fed forward on the tracks to the pick-up location, the oscillatory movement ceases, and the components can be clamped by lead clamping devices at the end of one or more tracks in preparation for robotic pick-up.

BRIEF DESCRIPTION OF THE DRAWINGS

These and other features and advantages of the present invention will become more apparent from the following detailed description of an exemplary embodiment thereof, as illustrated in the accompanying drawings, in which:

FIG. 4 is a side view of the feeder apparatus of FIG. 2.

FIGS. 5 and 6 are exploded perspective views of the apparatus of FIG. 2 taken with the apparatus cover plates removed.

FIGS. 7, 8, 9, 10A, 10B, 11A, and 11B illustrate the part clamp employed with the apparatus of FIG. 2.

FIG. 14 is a Boolean chart of the various control signals of the control circuit of FIG. 13.

FIGS. 16A-C illustrate an exemplary non-clamping end-of-track tooling which may be used in the feeder of FIG. 2.

DETAILED DESCRIPTION OF THE PREFERRED EMBODIMENT

Overview of the Invention

Figure 1:
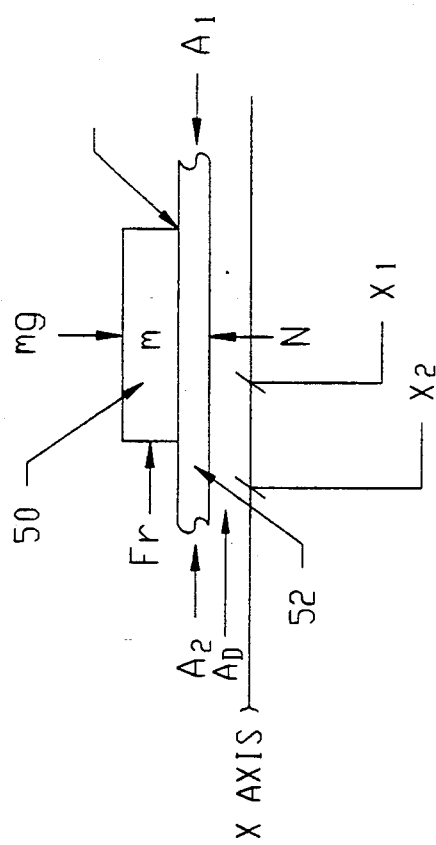
FIG. 1 is a force diagram illustrating the forces applied to a part on a moving plate as the invention operates to move the part.

A horizontal oscillatory feeder apparatus in accordance with the invention drives a component track with forces directed substantially only in directions along the extent of the track. As a result, the sensitivity of the feeder to component weight is substantially reduced in comparison to conventional vibratory feeder apparatus. Consider the conceptual diagram of FIG. 1. A component 50 of mass M is supported on track 52. Thus, the gravitational force exerted on the component 50 in a direction normal to the track 52 is MG, where G represents the gravitational acceleration. The track 52 exerts a counterforce N against the component 50, normal to the track. There is a frictional force $F_r$ which opposes relative motion between the component 50 and the track 52. $F_r$ is equal to $N \mu = MG \mu$, Where $\mu$ represents the coefficient of friction.

Now assume that the objective is to move the component along the track toward $X_2$ from $X_1$. One technique for obtaining this movement in accordance with the invention is to move the track 52 toward $X_2$ at an acceleration $A_1$ introduced by a drive mechanism. This acceleration is selected so that the acceleration $A_1$ times the mass M is less than the frictional force $F_r$ which opposes sliding of the component 50 relative to the track 52. The movement of the track 52 toward $X_2$ is stopped suddenly so that the track decelerates by D. However, the deceleration D is selected so that the deceleration D times the mass M exceeds the frictional force $F_r$ opposing the sliding of the component. As a result, the component 50 slips toward $X_2$ relative to the track 52 by some incremental amount. The track 52 is then returned toward $X_1$ by the drive mechanism, also at an acceleration $A_2$ selected so that the acceleration force applied to the component 50 does not exceed the frictional force $F_r$. As a result the component 50 does not slip relative to the track during this movement toward $X_1$. The track 52 is then stopped gradually so that the resulting deceleration force applied to the component 50 is less than the frictional force, again so that the component 50 does not slip on the track 52, which would result in undesired movement back toward $X_1$. The cycle of movements can then be repeated until the component 50 has been moved by a desired amount.

There is an alternate technique to obtain the desired movement in accordance with the invention. In accordance with the alternate approach, the track 52 is positioned with the component 50 at or near $X_2$, and then accelerated along the x axis toward $X_1$ by an acceleration $A_2$ which results in an acceleration force $A_2$ times the component mass M which is greater than $F_r$. This causes the component to slide on the track 52 in a relative direction toward $X_2$. Next, the track is subjected to an acceleration $A_1$ selected so that the resulting acceleration is $A_1$ times M is less than the frictional force to move the track back to its initial start location. During application of the acceleration $A_1$, the component does not slide on the track, since the acceleration times mass M is less than the frictional force. This sequence of accelerations, first in one direction and then in the other, is repeated to move the component to a desired point $X_2$.

In accordance with the invention, the track 52 is constrained against movement in the Y or Z direction, and the acceleration forces are applied only along the X axis. Hence, the feeder apparatus does not employ rotational accelerations which tend to launch the components off the track. As a result, feeder apparatus in accordance with the invention are considerably less sensitive to the mass of the components, and a single acceleration imparting means can be employed to feed different types of components simultaneously.

A Preferring Implementation

Figure 2:
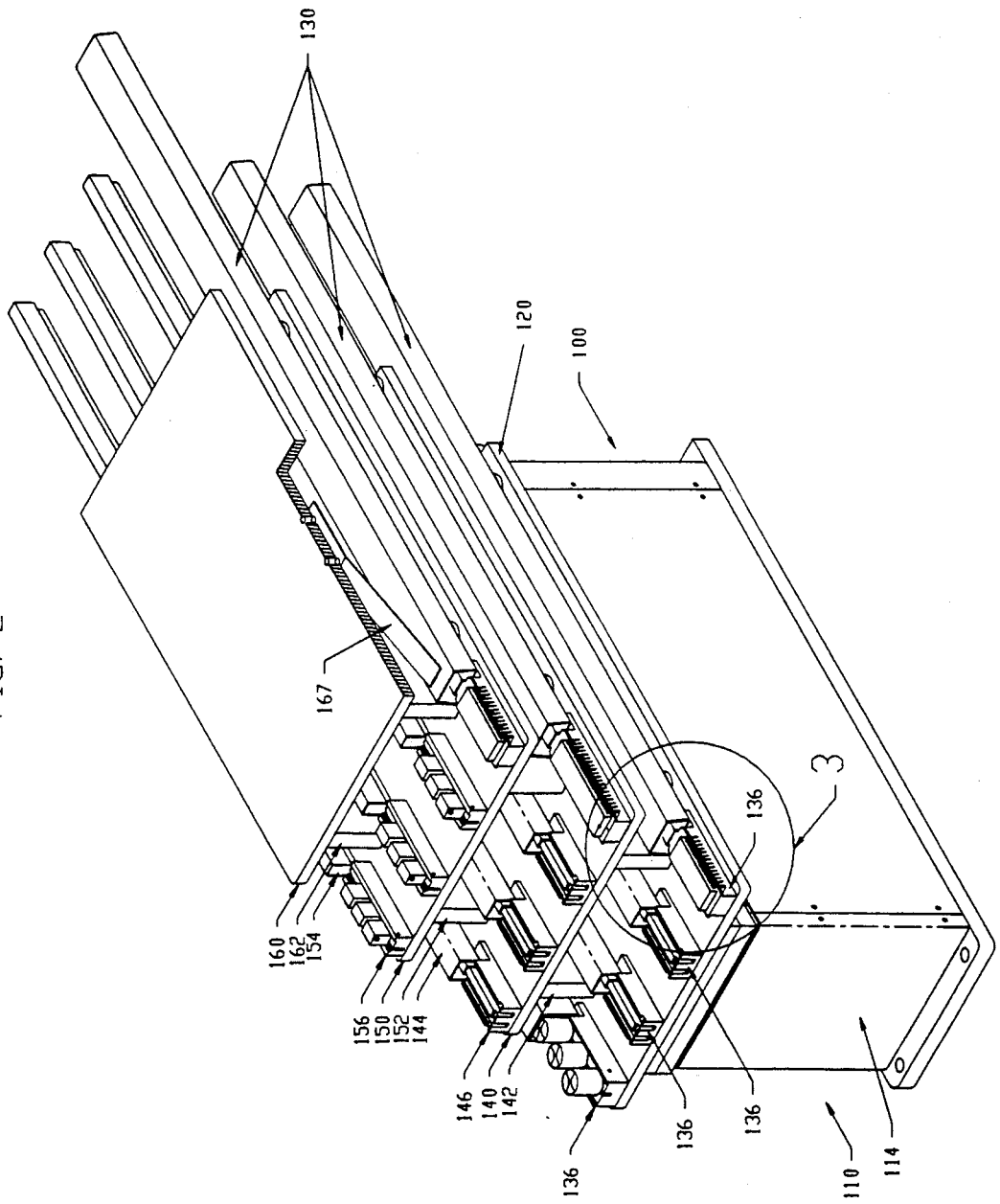
FIG. 2 is a perspective view of a preferred embodiment of a horizontal tube magazine feeder apparatus employing the invention.

Referring now to FIG. 2, a horizontal tube magazine feeder 100 embodying the invention is illustrated in perspective view. The feeder apparatus 100 comprises a base 110 which excites a base plate 120 with horizontal excitation forces. Secured to the base plate 120 are a plurality of tube magazines 130, each with corresponding end-of-track tooling (ETT) 136. Additional tiers of magazines 130 are supported by the base plate 120. Thus, second tier plate 140 is supported on columns 142 extending from base plate 120, third tier plate 150 is supported on columns 152 extending from second tier plate 140, and fourth tier plate 160 is supported on columns 162 extending from the third tier plate 150. Additional tube magazines 144 and ETT 146 are in turn supported on the second tier plate 140. Additional tube magazines 154 and ETT 156 are supported on the third tier plate 150. Additional magazines can be added to the fourth tier plate, and so on. Springs 167 hold the respective magazines 130 in position. An advantage of the tiering of the magazines is that the feeder apparatus can be constructed with a relatively narrow footprint while having the capability of feeding parts from a plurality of tube magazines.

As shown in FIG. 2, the feeder 100 can be employed to feed different types of components, with suitable provision for different corresponding ETT. This is a major advantage of the feeder 100, resulting from the relative insensitivity of the feeder to the mass of the components.

Figure 3:
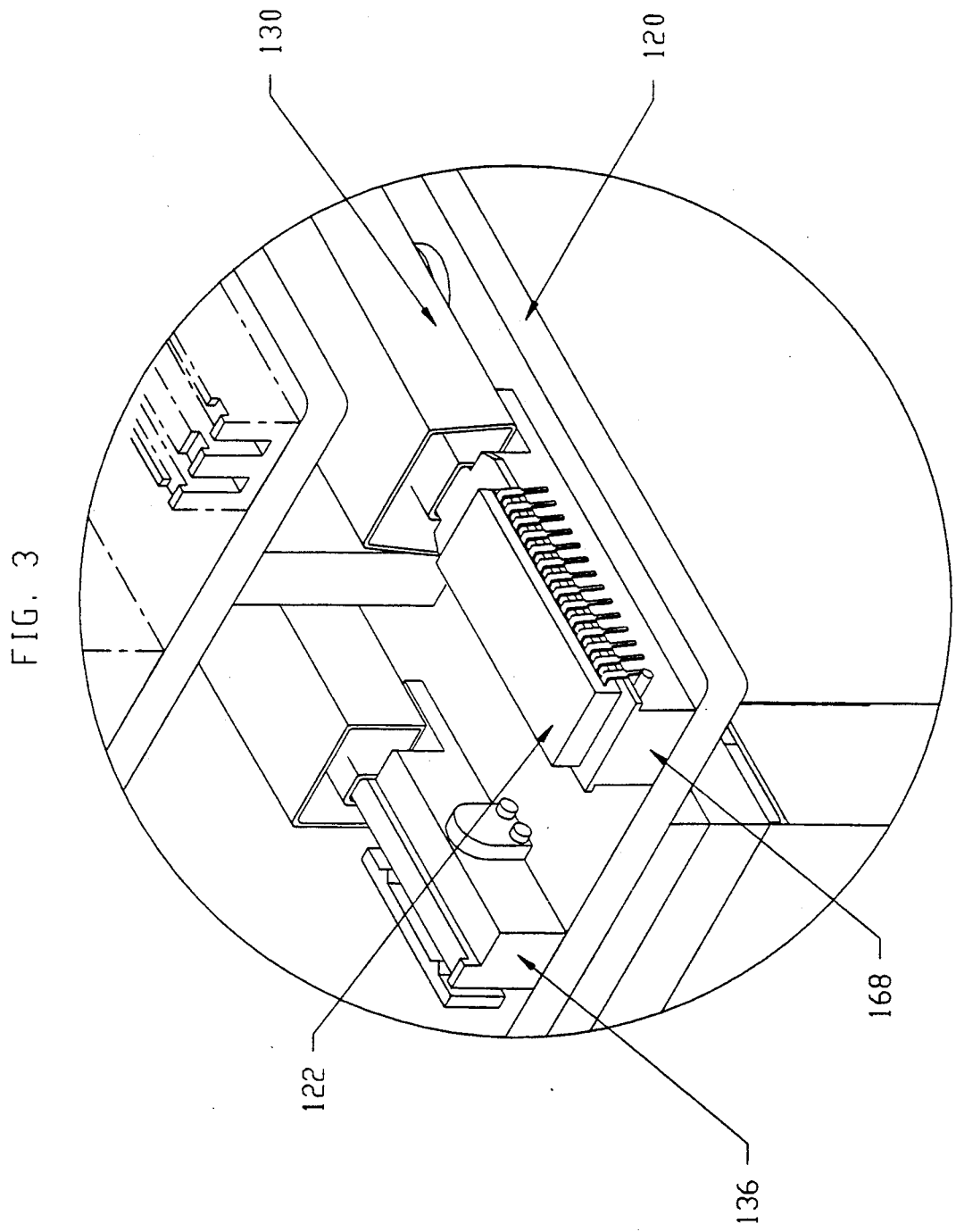
FIG. 3 is an enlarged view of the elements depicted within the phantom circle 3 of FIG. 2.

FIG. 3 is an enlarged view of the area within phantom circle 3 of FIG. 2. Shown in further detail are the base plate 120, the tube magazine 130 and an exemplary clamping (ETT) 136, and the exemplary component 122 located at the ETT 136. FIG. 3 also illustrates a non-clamping ETT 168. More clearly shown in FIGS. 16A-C, the ETT 168 includes a tongue portion 168A which fits into the end o the magazine 130 to provide a substantially continuous track section over which the component 122 can slide. In this exemplary embodiment, lead stop pins 168B provide a stop surface against which the leads of the component 122 will contact at the end of the feeder travel. Thus, the pick-up position for the component is registered by the pins 168B.

FIGS. 4–6 illustrate the base unit 110 of the feeder apparatus 100 in further detail. The side perspective exploded views of FIGS. 5 and 6 illustrate the base unit 110 with its side covers removed, and illustrate the excitation apparatus in further detail. The unit 110 comprises a base support plate 111, from which upstanding end plates 112 and 114 extend. A subplate 116 is secured across the end plates 112 and 114, with plate 114 oriented at the front of the feeder 100. Shafts 118 and 119 are also secured to each end plate by shaft supports 171-174.

The shafts 118 and 119 comprise bearings which constrain the movement of the base plate in directions parallel to the shafts 118 and 119. Bearing pillow blocks 184 and 186 have corresponding bores formed therein to receive the shaft 119, and are secured to the underside of the plate 120. Bearing pillow blocks 188 and 190 have corresponding bores formed therein to receive the shaft 118, and are secured to the underside of the plate 120. As a result of the shafts and bearing pillows, the plate 120 can move relative to the base unit 110 only along the direction of the X axis.

A double acting pneumatic cylinder 176 has its base end 178 secured to a post 180 extending from the subplate 116. The extensible cylinder piston 182 is coupled to a plate bracket 124 by a clevis 183 (FIG. 4). The plate bracket 124 is in turn secured to the underside of the base plate 120. It will be apparent that the base plate 120 may be moved or oscillated by extending or retracting the piston 182. However, due to the bearing support of the plate 120 to the base unit 110, the movement or oscillation of the base plate 120 is limited to movements along the direction of the X axis.

A first hard stop element 214 is secured to the plate bracket 124, which is carried by the base plate 120 (FIG. 4). A second hard stop element 216 is secured to hard stop bracket 218 in turn secured to the stationary plate 110. The hard stop elements 214 and 216 are made of hardened steel to prevent wear, and are positioned so that the hard stop elements will contact each other when the piston is fully retracted, to provide a known position of the plate 120 for purposes of component pick-up.

An elastomeric dampener stop element 220 is mounted in a socket formed in bracket 219 mounted on stationary plate 110. The element 220 may comprise, e.g., durometer 40 silicon rubber. Element 220 provides a dampened stop surface, against which hard stop element 213, also mounted on the plate bracket 124 (FIG. 4) contacts when the piston 182 of cylinder 176 is extended. As will be explained more fully below, during operation of the feeder, the piston 182 will be oscillated through a short stroke to oscillate the plate 120. As the piston is extended, the hard stop 213 runs into dampener stop 220, abruptly stopping the travel of the piston (and the plate 120). This abrupt, dampened stop imparts the acceleration force to components carried by the plate 120 which results in slippage in the desired direction.

The base unit 110 further includes a hydraulic dampener 200 which comprises a rod 202 mounted in a bore formed in a support block secured to the subplate 116. The rod 202 is spring-loaded or biased in the extended position shown in FIG. 5. The end of the rod 202 contacts the dampener lever 212 when the piston 182 of the cylinder 176 is retracted to dampen the deceleration of the bas plate 120 at the end of the retraction stroke, as the hard stop elements 214 and 216 are brought together. Devices suitable for use as the dampener 200 are commercially available; one such unit is the model CB-OEM-0.25B1, marketed by Endine Inc., Center Drive, Orchard Park, N.Y. 14127.

The apparatus 100 further includes a "feeder ready" sensor 250 secured to the stationary plate 116, which is triggered by the sensor block 252 secured to the movable plate 120 when the cylinder piston 182 has fully retracted and the hard stop elements 214 and 216 are brought together. When the sensor 250 is triggered, this indicates the feeder is ready for robotic component pick-up operations. In an exemplary embodiment, the model VX-80 sensor marketed by Microswitch, 505 S. Main Street, Orange, Calif. 92668, is suitable for use as the sensor 250.

Referring now to FIGS. 7-11, an exemplary one 136 of the ETT (ETT) is illustrated in further detail. Generally, the ETT 136 comprises a pneumatic cylinder actuator 1361 which opens and closes a clamp/comb element 1362 against the leads of the component 122 disposed by the feeder apparatus at the ETT. The element 1362 is mounted on sliding guide pins 1363. The cylinder 1361 is a single acting cylinder, and is spring loaded to bias the clamp/comb element 1362 away from the surface 1364 of the ETT 136, releasing the leads of the component 130, and can be actuated to pull the element 1362 toward the surface 1364, clamping the leads of the component 130 therebetween.

It will be appreciated that not all of the ETT on the feeder need include lead clamping. While clamping is usually required for components which are to be directly inserted from the feeder apparatus into a location on a circuit board, other components may require additional processing prior to board insertion, e.g., lead straightening. For such kinds of components, the clamping may not be required, and the ETT may be in the form of a simpler structure as shown in FIGS. 16A-C.

FIG. 8 shows the cross-sectional configuration of the ETT 136, and in particular the raised track section 1367 onto which the component 122 slides. Each ETT in this embodiment is tailored to a particular component configuration. As shown in FIGS. 3, 7, 10A and 11A, the tube magazines are supported with an open end thereof adjacent the ETT track 1367 so that components within the tube can be urged onto the track section 1367 during the oscillatory operation of the feeder apparatus 100 generally described above. FIGS. 10A and B show the clamp/comb element 1362 in the open position; FIGS. 11A and B show the element 1362 in the closed position. It is possible for each ETT comprising the feeder 100 to be configured to handle a different part or component configuration.

Figure 12:
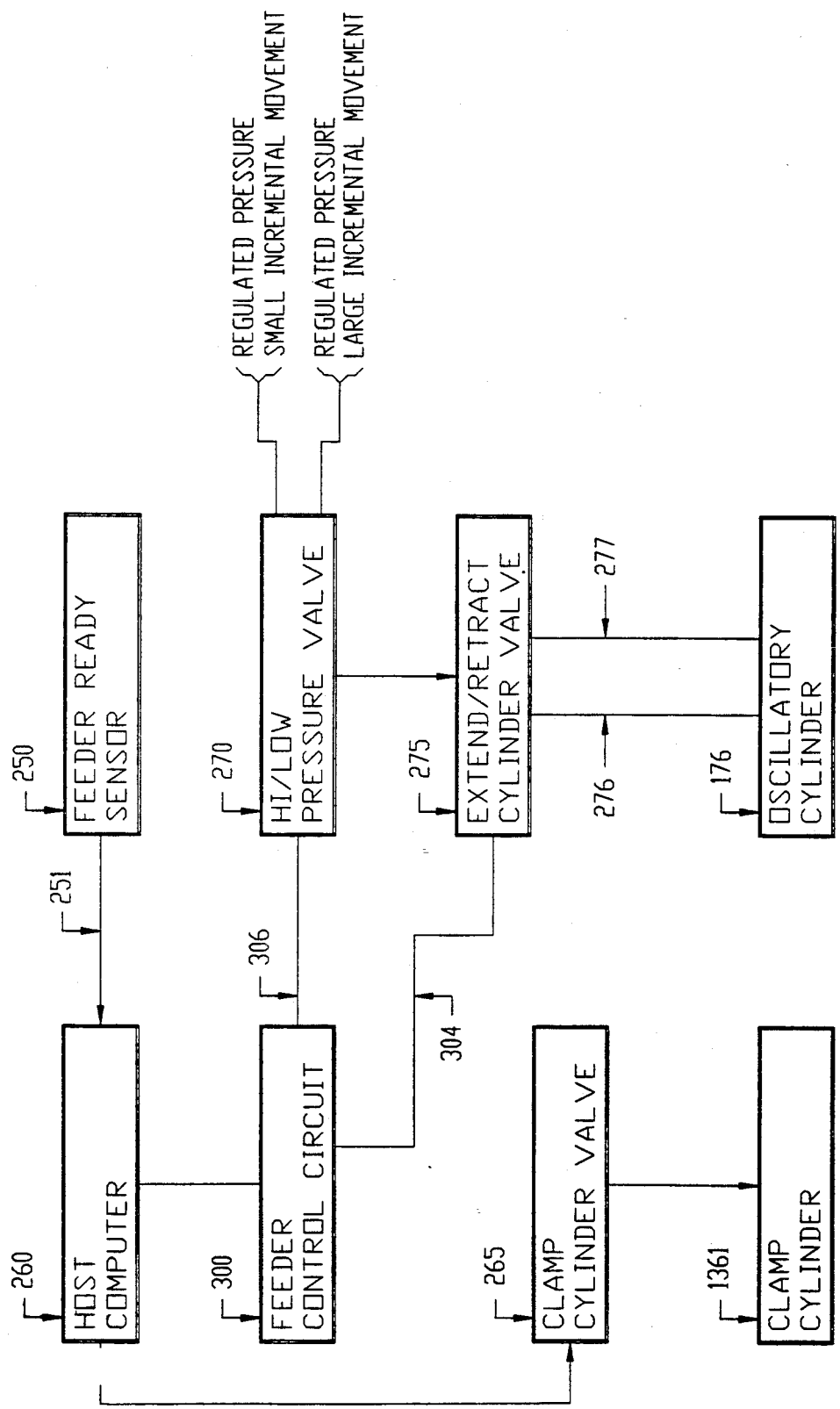
FIG. 12 is a simplified functional block diagram of the control elements comprising the feeder apparatus of FIG. 2.

FIG. 12 is a simplified functional block diagram of the control elements of the feeder apparatus 100. The feeder apparatus 100 is controlled by a host computer 260 which will typically control all the devices comprising the system in which the apparatus 100 is installed, e.g., a pick-up robot, an insertion robot, other feeder devices, circuit board transport devices, and the like, e.g., as more particularly described in U.S. Pat. No. 4,910,859. The host computer 260 receives the output of the feeder ready sensor 250. Once this sensor 250 has been tripped, the computer 260 knows that it can instruct the pick-up robot to move to the feeder apparatus 100 to pick up a component.

The computer 260 also controls the operation of the apparatus 100 to feed the components forward to the pick-up locations. This is performed by providing control signals to the feeder control circuit 300 to initiate the oscillatory movement cycle and control its duration. The circuit 300 in turn provides appropriate control signals to control the oscillatory cylinder 176. In the preferred embodiment, each refresh cycle nominally comprises two successive oscillation modes. During the first oscillation mode, the movement of the piston 182 is controlled so that relatively large acceleration forces are exerted on the components in the desired direction of travel so that, for each oscillatory piston stroke cycle, a relatively large incremental movement of the component is obtained, say ½ the component length or somewhat less. The first, large increment movement mode quickly advances the components, and is particularly useful for refreshing relatively large (long) components within a relatively short time, since such parts have a longer distance to travel than shorter parts. The relatively large movement mode can result, once the component reaches the ETT, in undesirable bouncing or vibration of the component at the ETT. Hence, following the first large incremental movement mode, a small incremental mode is performed. During this second mode, the component is advanced a relatively small incremental movement, say 1/16 the component length or smaller. As a result, the component may be reliably brought to the ETT with a reduction in component vibration which would otherwise occur with the first mode.

In this exemplary embodiment, the circuit 300 generates a signal which controls valve 270 to select between the relatively high line air pressure and the lower regulator pressure. Air pressurized at the selected pressure is supplied to the extend/retract cylinder valve 275 which controls the operation of the cylinder 176, by pressurizing line 276 at the selected pressure and opening line 277 to extend the piston 182, or pressurizing line 277 at the selected pressure and opening line 276 to retract the piston. The circuit 300 generates a signal which operates the valve 275 to either extend or retract the piston 182. The oscillatory movement is achieved by repetitively actuating the valve 275 to successively extend and retract the piston through a relatively small range of movement. In the disclosed embodiment, the cylinder piston is first extended so that the dampener stop element 220 is contacted by the hard stop 213. The cylinder 176 is then repetitively oscillated by repetitively retracting the piston by relatively small amounts and then extending the piston. For each complete oscillation cycle, as the piston is extended, the piston travel is abruptly stopped by the hard stop element 213 running into the dampener stop element 220. As a result, the acceleration forces on the components carried by the plate 120 exceed the frictional force $F_r$, and there is slippage of the component in the desired direction. As the piston is retracted and then extended, there is sufficient dampening of this change in direction inherent in the operation of the valve 275 and cylinder 176 that the acceleration forces exerted on components carried by the plate 120 are less than the frictional $F_r$, and there is no slippage as a result due to this change in direction.

In the exemplary embodiment, the host computer 260 controls the duration of the large and small increment movement modes for each feeder refresh cycle. Since the host computer will typically know which particular type of component was just picked up (removed) from its ETT, the computer can tailor the refresh cycle duration to the requirements to refresh a particular component. A relatively long component will require relatively longer refresh cycle durations than relatively short components. The computer 260 can include a stored table of component types and corresponding predetermined parameters of the durations of both the large and small increment modes. In the exemplary embodiment, the goal is to obtain refresh cycles of a maximum duration of 3.5 seconds, although some types of components may require only, e.g., one second refresh cycles. By tailoring the parameters of the refresh cycle to only operate the refresh cycle as long as actually needed to feed the component to be refresh, unnecessary wear and tear on the refresh apparatus can be avoided. Alternatively, the refresh cycle parameters may be fixed, typically selected for the largest mass component contemplated to be fed by the apparatus. All components can be refreshed using a refresh cycle with these parameters. This alternative would simplify the control functions, and it would be unnecessary for the host computer to know which component type had just been picked up.

In an exemplary embodiment, the control circuit 300 controls the duration of time the cylinder control valve 275 remains actuated in the piston extend or the piston retract mode, thereby controlling the piston oscillation stroke. The circuit 300 also selects upon command from the computer 260 either the high or low air pressure, which by increasing or decreasing the acceleration force applied to the piston also affects the length of the oscillation stroke. Thus, in one exemplary embodiment, the oscillation stroke in the large increment movement cycle is nominally ⅛ inches, and the small increment oscillation stroke is nominally ⅜ inches. While obviously dependent on the type of cylinder and air pressure values, one typical application may employ nominal time durations of 100 microsecond piston extend valve operation, and 115 microsecond piston retract valve operation for the large increment cycle, and respective time constants of 95 and 105 microsecond piston extend and retract valve operation for the small increment cycle. As set forth above, in the exemplary embodiment, the host computer 260 controls the number of large and small increment oscillations in a particular refresh cycle; the computer 260 in this embodiment does not control the duration of each such oscillation. That duration is adjusted at the factory by adjustments to the circuit 300 so that under normal operation the user need not adjust this parameter in the field.

Figure 13:
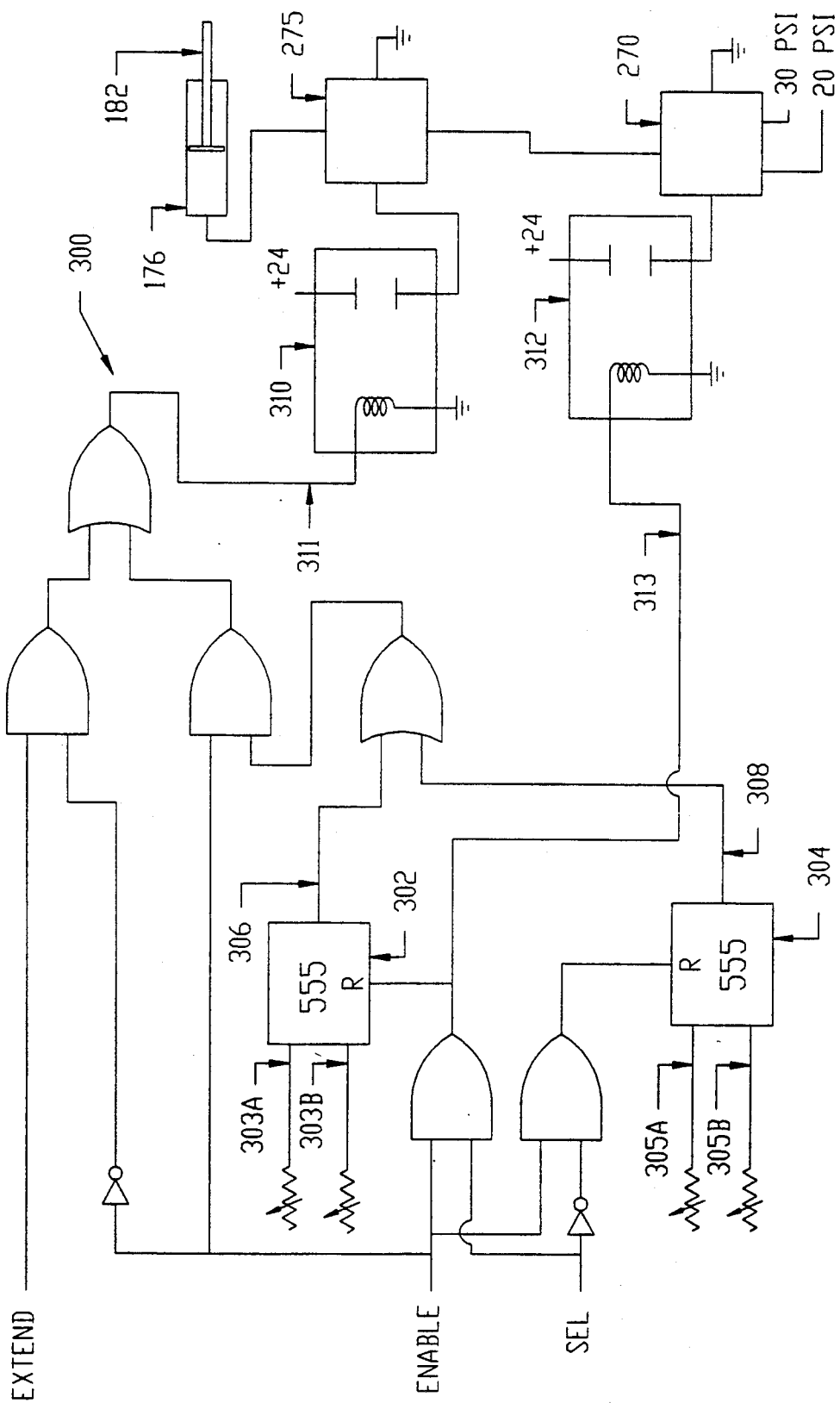
FIG. 13 is a simplified circuit schematic of the control circuit comprising the apparatus of FIG. 2.

FIG. 13 illustrates the control circuit elements and control signals from the computer 260, and their interrelationship with the valves 270 and 275. The host computer 260 provides three control signals (ENABLE, SEL AND EXTEND) to the control circuit 300. The host computer 260 also directly controls the ETT clamp cylinders 1361 via a fourth control signal CLAMP (not shown in FIG. 13).

The circuit 300 includes logic to perform selection functions, to selectively extend and retract the cylinder 176 piston, and to generate the valve control signals to oscillate the piston of the cylinder 176 about its extended position. The circuit 300 includes two free running signal generators 302 and 304 which generate square wave signals whose periodicity is determined by selection of the R-C time constants, in the manner well known to those skilled in the art. Variable resistors 303A and 303B for generator 302 and 305A and 305B are provided to enable factory adjustments of the time constants to achieve a desired duration of the piston extend and retract oscillatory movements. In this particular embodiment, the value resistor 303A determines the extend piston time duration, i.e., the length of time the output signal 306 is in the active state during a particular cycle. Resistor 303B determines the retract piston time duration, i.e., the length of time the output signal 306 is in the inactive state during a particular cycle. Variable resistors 305A and 305B control similar parameters of the output signal 308.

The circuit 300 performs logical combinations of the control signals from the host computer and the outputs 306 and 308 to first extend the piston of cylinder 176, and then to oscillate the piston by application of a selected one of the signal generator outputs 306 and 308 to the valve relay 310 which controls the cylinder 275. The circuit also performs a logical combination of the control signals ENABLE and SEL to control the valve relay 312 to supply either the high or low air pressure to the valve 275.

FIG. 14 sets forth a Boolean table showing the possible combinations of the control signals, the signal generator outputs and the two relay signals, thereby illustrating the logical operation of the circuit 300.

The typical refresh cycle starts with an active EXTEND signal, which serves to enable the cylinder valve relay to extend the piston 182 of the cylinder 176. After a predetermined delay to allow the piston to reach its extended position, the host computer generates an active SEL signal, thereby selecting the high air pressure and the signal generator 302 signal to control the valve relay 310. Then an active ENABLE signal is provided, which serves to override the EXTEND signal. The circuit 300 thus allows the large increment movement cycle to operate for a duration determined by the host computer 260, during which time the piston 182 is extended and retracted about its extended position as determined by the output 306 of the signal generator 302.

The host computer 260 terminates the large increment movement cycle and initiates the small increment cycle by switching the state of control signal SEL from the active to the inactive state, thereby causing the output 308 of the signal generator 304 to be selected as the signal controlling the relay 310, and also selecting the low air pressure by switching the relay 312. Now the piston 182 is extended and retracted about the extended position under control of the output 308 of signal generator 304, which has a relatively higher frequency than the frequency of generator 302 as set forth above. The higher frequency and lower air pressure results in shorter movement strokes of the piston than for the large increment movement cycle.

After a predetermined time duration of the small increment cycle, the oscillatory movement is terminated by bringing the ENABLE signal to the inactive state, ceasing the oscillation of the piston 182. The host computer 260 then provides an active CLAMP signal to actuate the ETT clamps, thereby clamping the respective component leads. Thereafter, the ENABLE signal is brought to the inactive state to disable the relay 310, thereby retracting the piston 182 to the fully retracted position wherein the hard stop elements 214 and 216 are brought together. At this point the feeder ready sensor generates a sensor signal recognized by the host computer 260 as an indication that the feeder apparatus 100 is refreshed.

Figure 15:
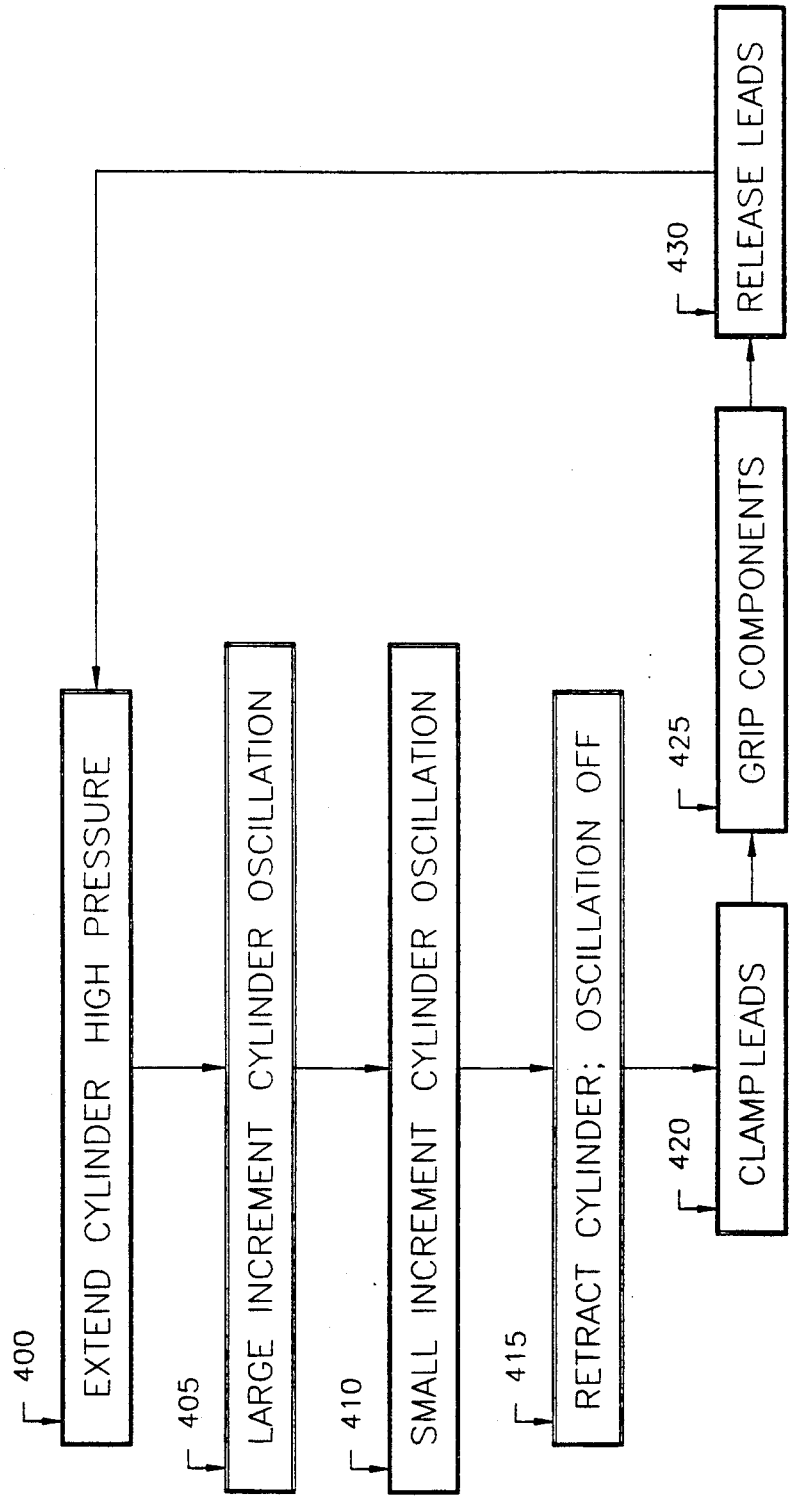
FIG. 15 is a simplified flow diagram illustrative of the operation of the apparatus of FIG. 2.

FIG. 15 is a simplified flow diagram illustrative of the general operation of the horizontal oscillator feeder apparatus 100. At step 400, the piston of the cylinder 176 is extended, and the high pressure air is selected by operation of valve 275. At step 405, the control circuit 300 is actuated by the host computer 100 to commence large increment movement oscillations. This continues for a duration set by the host computer 260 in dependence on the last component type picked up from the feeder as described above. Next, at step 410, the mode for small increment movement oscillation is selected by operation of valve 275, and the control circuit 300 causes high frequency cylinder oscillation. At step 415, small increment movement oscillations cease, and the piston of cylinder 176 is retracted, thereby bringing the respective hard stop elements 214 and 216 against each other and precisely locating the position of the base plate 120 in relation to the base structure 110. This precise locating of the plate 120 permits robotic pick-up of desired ones of the components at the pick-up locations. The ETT cylinders are actuated to cause the clamp/comb elements to grip the component leads, at step 420, and the component is now ready for robotic pickup. At step 425, the pickup robot grips the body of the component clamped by the ETT, and at step 430, the ETT cylinders are controlled to release the component leads, permitting the pickup robot to remove a desired component from the feeder apparatus and withdraw it for use elsewhere.

In the preferred embodiment described above, the small and large increment movement cycles have been obtained by controlling the air pressure applied to the cylinder 176, and by factory adjusting the length of time the cylinder is actuated in the extend and retract portions of the oscillatory cycles. It will be appreciated that the small and large movement cycles can be obtained in other ways. For example, similar small and large movement increments can be obtained solely by controlling the relative lengths of time the cylinder is actuated in the extend and retract modes, or by solely controlling the air pressure applied to the cylinder during the small and large increment movement modes, leaving unchanged the lengths of time the cylinder is actuated in the extend and retract modes.

It has also been found that for small components, it is unnecessary to employ a large increment movement oscillation mode, since the small increment movement cycle will move the components along at the required rate. In this instance, the duration of the large increment oscillation can be set to zero, if the computer 260 is controlling the oscillation mode durations in dependence on the size of the component to be refreshed. Conversely, other components may be satisfactorily fed into the ETT without the use of a small increment movement mode.

A horizontal feeder apparatus has been disclosed, which offers many advantages. For example, the feeder can feed dissimilar components of various sizes and masses. It has a relatively narrow footprint, conserving valuable space. The feeder does not require the components to turn any corners, which would lead to component jams. The leads of the components are not damaged or bent by operation of the oscillatory drive means.

It is understood that the above-described embodiments are merely illustrative of the possible specific embodiments which may represent principles of the present invention. Other arrangements may readily be devised in accordance with these principles by those skilled in the art without departing from the scope of the invention. For example, there are many possible ways to implement the drive means for obtaining the desired component accelerations. For example, instead of a pneumatic cylinder, possible exemplary drive elements include electric solenoids, linear motors, and rotating motors running gear sets. Moreover, it will be appreciated that many other alternate control arrangements could be employed. For example, the operation of the feeder apparatus could be controlled completely by a host computer without the need of an internal feeder control circuit, or completely by an internal circuit without control by an external controller, instead of by the combined host controller-feeder control circuit described above.

What is claimed is:

1. Apparatus for feeding an electrical component in a desired direction along a track extending along a track axis, comprising:
    means for constraining the track from moving except in directions along said axis; and
    means for oscillating said track in directions along said axis to achieve acceleration forces on said electrical component which exceed the frictional force between the track and said component in said desired direction, thereby resulting in slippage of said component in relation to the track and feed said component along the track in the desired direction.

2. The apparatus of claim 1 wherein said acceleration forces on said electrical component which exceed said frictional forces are achieved when the track oscillation movement direction is reversed from a first direction to a second direction.

3. The apparatus of claim 2 further comprising dampening means for abruptly changing said direction of said oscillation movement.

4. The apparatus of claim 1 wherein said track is mounted on a support element such that said track axis is substantially horizontal, and said constraining means comprises a bearing for guiding said support element along said directions along said axis.

5. The apparatus of claim 4 wherein said means for oscillating said track comprises a pneumatic cylinder arranged to drive said support element in said directions along said track axis.

6. The apparatus of claim 5 wherein said pneumatic cylinder comprises a piston which may be selectively extended and retracted, and means for repetitively extending and retracting said piston through an oscillation stroke.

7. The apparatus of claim 4 wherein said acceleration forces on said electrical component which exceed said frictional forces are achieved when the direction of the track movement is reversed from movement in said desired direction to movement in the direction opposite to said desired direction.

8. The apparatus of claim 7 further comprising dampening means for abruptly stopping the movement of said support element in said desired direction.

9. The apparatus of claim 8 wherein said dampening comprises a stop element disposed so that said support element runs into said stop element at the end of the movement in said desired direction.

10. Apparatus for feeding an object in a desired direction along a track extending along a track axis and mounted on a support element such that said track axis is substantially horizontal, comprising:
    means for constraining the track from moving except in directions along said axis, said means comprising a bearing for guiding the support element along said directions along said axis;
    means for oscillating said track in directions along said axis to achieve acceleration forces on said object which exceed the frictional force between the track and the object in said desired direction, said means for oscillating said track comprising a pneumatic cylinder arranged to drive the support element in said directions along said track axis and wherein said pneumatic cylinder comprises a piston which may be selectively extended and retracted, and means for repetitively extending and retracting said piston through an oscillation stroke; and
    wherein said means for oscillating said track comprises first oscillation means for repetitively oscillating said track in such a manner as to apply relative larger acceleration forces on said object in the direction of desired movement to move said object by a relatively large increment on each stroke cycle to relatively large increment qucikly move said object along said track during a large increment cycle mode, and second oscillating means for repetitively oscillating said track in such a manner as to apply relatively smaller acceleration forces on said object in the direction of desired movement which are smaller than said relatively large acceleration to move said object by a relatively smaller increment on each second oscillation cycle during a small increment oscillation cycle mode;

thereby resulting in slippage of the object in relation to the track and feeding the object along the track in the desired direction.

11. The apparatus of claim 10 further comprising means for selecting the large increment and small increment cycle mode durations in dependence on the size of the object being fed along said track.

12. The apparatus of claim 10 wherein the large increment and small increment cycle mode durations are fixed.

13. The apparatus of claim 1 further comprising means for controlling the operation of said oscillating means in dependence on the length of said electrical component.

14. The apparatus of claim 13 wherein said apparatus is operated to feed a succession of said electrical components along said track, and further comprising means for controlling said oscillating means to operate for a time duration necessary to feed an electrical component a given distance, and means for selecting said time duration in dependence on said given distance.

15. The apparatus of claim 14 wherein said given distance is dependent on the length of said electrical component.

16. Horizontal tube magazine feeder apparatus for feeding electrical components of different sizes from a plurality of tube magazines in a desired direction, comprising:

magazine support means for supporting said plurality of tube magazines in a generally horizontal plane or planes;

means for exciting said support means with horizontal excitation forces to move said tube magazines in an oscillatory fashion and achieve acceleration forces on said components in said desired direction which exceed the frictional forces tending to prevent sliding of the components within said magazines, thereby feeding said components in said desired direction; and means for constraining the movement of said magazine support means during said excitation by said exciting means so that said support means is permitted to move only along an axis extending along said desired direction.

17. The apparatus of claim 16 wherein said magazine support means comprises a base support plate disposed in a generally horizontal plane for supporting said plurality of tube magazines.

18. The apparatus of claim 17 wherein said plurality of said tube magazines are supported by a surface of said base support plate, and said support means further comprises at least one tiered support plate supported above said base plate and supporting a further plurality of said tube magazines above said magazines supported by said surface of said base plate.

19. The apparatus of claim 16 further comprising a plurality of end-of-track tooling (ETT) means secured in alignment with an open end of said tube magazines in the direction of said desired movement so that said components are fed out of said tube magazines onto said ETT means, and wherein said plurality of ETT means includes at least one clamping ETT means for clamping the leads of said components fed onto said clamping ETT means, and at least one non-clamping ETT means wherein the component is not clamped at said ETT means.

20. The apparatus of claim 19 wherein said non-clamping ETT means comprises lead stop means for stopping the further movement of said component on said ETT means by contacting one or more leads of said component.

21. The apparatus of claim 16 further comprising means for controlling the duration of operation of said exciting means in dependence on the length of a particular one of said components to be fed in said desired direction.

22. A horizontal tube magazine feeder apparatus for feeding electrical components from one or more tube magazines in a desired direction, comprising:

a magazine support plate disposed in a generally horizontal plane for supporting said one or more tube magazines;

a based structure for supporting said support plate and exciting said plate with horizontal excitation forces, comprising bearing means for preventing movement of said plate except along directions parallel to said desired direction, exciting means for moving said plate along directions parallel to said one or more tube magazines in an oscillatory fashion and achieving acceleration forces on said component in said desired direction which exceed the frictional forces tending to prevent sliding of the component within said tube magazine, thereby feeding said components in said desired direction.

23. The apparatus of claim 22 wherein said acceleration forces on the components in said direction of desired movement which exceed the frictional forces are achieved as the plate oscillation movement along one direction is stopped.

24. The apparatus of claim 23 further comprising means for abruptly stopping said plate oscillation movement along said one direction.

25. The apparatus of claim 24 wherein said stopping means comprises a dampener stop element secured to said base structure and against which stop element a structural means secured to said plate comes into contact to stop said movement along said one direction.

26. The apparatus of claim 22 wherein said exciting means comprises a pneumatic cylinder means having a first end secured to said base structure, a second end secured to said plate, and a piston, and means for selectively extending and retracting said piston to impart oscillatory forces to said plate.

27. The apparatus of claim 22 further comprising end-of-track tooling (ETT) means disposed at an end of each of said one or more tube magazines to which said apparatus feeds components, said ETT means comprising means for establishing respective component pick-up locations for picking up components from said ETT means.

28. The apparatus of claim 27 wherein said ETT means for at least one of said tube magazines includes means for clamping one or more leads of said components at said pick-up location.

29. The apparatus of claim 28 wherein said ETT means for at least another one of said tube magazines does not include lead clamping means, wherein components are picked up from said track pick-up location without clamping the leads at said pick-up location.

30. The apparatus of claim 22 wherein said apparatus comprises means for supporting a plurality of tiers of tube magazines on said magazine support plate, and further comprises end-of-track tooling (ETT) means for each tube magazine.

31. The apparatus of claim 22 wherein said magazine support plate supports a plurality of tube magazine which hold a plurality of types of components of different sizes.

32. Apparatus for feeding an object in a desired direction along a track extending along a track axis and mounted on a support element such that said track axis is substantially horizontal, comprising:

means for constraining the track from moving except in directions along said axis, said constraining means comprising a bearing for guiding the support element along said directions along said axis;

means for oscillating said track in directions along said axis to achieve acceleration forces on said object which exceed the frictional force between the track and the object in said desired direction when the direction of the track movement is reversed from movement in said desired direction to movement in the direction opposite to said desired direction;

dampening means for abruptly stopping the movement of said support element in said desired direction, said means comprising a stop element secured to a stationary structure and disposed so that said support element runs into said stop element at the end of movement in said desired direction, thereby resulting in slippage of the object in relation to the track and feeding the object along the track in the desired direction.

33. The apparatus of claim 32 wherein said stop element comprises an elastomeric member.

34. A horizontal tube magazine feeder apparatus for feeding electrical components from one or more tube magazines in a desired direction, comprising:

a magazine support plate disposed in a generally horizontal plane for supporting said one or more tube magazines;

a base structure for supporting said support plate and exciting said plate with horizontal excitation forces, comprising:

bearing means for preventing movement of said plate except along directions parallel to said desired direction, said bearing means comprising at least one bearing shaft mounted to said base structure along a direction parallel to said axis, and at least one bearing pillow block secured to a lower surface of said support plate and having an opening formed therein in which said shaft is received, wherein movement of said block along said shaft is permitted, and movement in directions not parallel to said bearing shaft is constrained, and exciting means for moving said plate along directions parallel to said one or more tube magazines in an oscillatory fashion and achieving acceleration forces on said component in said desired direction which exceed the frictional forces tending to prevent sliding of the component within said tube magazine, thereby feeding said components in said desired direction.

35. The apparatus of claim 34 wherein said bearing means comprises two said bearing shafts mounted parallel to each other, and for each shaft, two pillow blocks secured to said lower surface of said plate.

* * * * *